US009041389B2

(12) United States Patent
Gokmen et al.

(10) Patent No.: US 9,041,389 B2
(45) Date of Patent: May 26, 2015

(54) HALL MEASUREMENT SYSTEM WITH ROTARY MAGNET

(75) Inventors: Tayfun Gokmen, Briarcliff Manor, NY (US); Oki Gunawan, Fair Lawn, NJ (US)

(73) Assignee: International Business Machines Corporation, Armonk, NY (US)

( * ) Notice: Subject to any disclaimer, the term of this patent is extended or adjusted under 35 U.S.C. 154(b) by 318 days.

(21) Appl. No.: 13/568,627

(22) Filed: Aug. 7, 2012

(65) Prior Publication Data
US 2014/0028306 A1 Jan. 30, 2014

Related U.S. Application Data (63) Continuation of application No. 13/560,404, filed on Jul. 27, 2012.

(51) Int. Cl.
*G01R 33/06* (2006.01)
*G01R 33/07* (2006.01)
*F04D 11/00* (2006.01)
*G01R 33/02* (2006.01)

(52) U.S. Cl.
CPC ............... *G01R 33/07* (2013.01); *F04D 11/00* (2013.01)

(58) Field of Classification Search
CPC .... G01R 33/07; G01R 33/1215; G01R 29/12; G01N 27/745; F04D 11/00; F04D 13/027; G05B 2219/37184
USPC .............. 324/71.1, 71.4, 204, 214–217, 226, 324/228, 235, 251, 252
See application file for complete search history.

(56) References Cited

U.S. PATENT DOCUMENTS

| 3,821,638 | A | 6/1974 | Kobayashi et al. | |
|---|---|---|---|---|
| 6,236,183 | B1 * | 5/2001 | Schroeder | 318/721 |
| 6,822,418 | B2 * | 11/2004 | Harke | 318/807 |
| 7,078,919 | B2 | 7/2006 | Prussin | |
| 7,265,539 | B2 | 9/2007 | Rutkowski et al. | |

(Continued)

FOREIGN PATENT DOCUMENTS

CN 201133933 Y 10/2008
JP 5262459 B2 8/2013

(Continued)

OTHER PUBLICATIONS

Lupu, N.Z., et al.; "Apparatus for Measuring the Hall Effect of Low-Mobility Samples at High Temperatures"; The Review of Scientific Instruments; vol. 38, No. 11; p. 1658-1661; Nov. 1967.

(Continued)

*Primary Examiner* — Tung X Nguyen
*Assistant Examiner* — Raul Rios Russo
(74) *Attorney, Agent, or Firm* — Cantor Colburn LLP; Vazken Alexanian (57) ABSTRACT

One or more embodiments are directed to a motor configured to rotate at least one magnet at a first frequency, a sensor configured to generate a reference signal of the at least one magnet's rotation, and a lock-in detection system configured to receive the reference signal, supply an excitation current at a second frequency to a device under test, measure a voltage from the device under test and demodulate the second frequency, and demodulate the first frequency from the measured voltage using the reference signal to obtain a Hall voltage associated with the device under test.

20 Claims, 4 Drawing Sheets

(56) References Cited

U.S. PATENT DOCUMENTS

| | | | |
|---|---|---|---|
| 7,785,330 B2* | 8/2010 | Sherman et al. | 606/96 |
| 2006/0170225 A1* | 8/2006 | Macken | 292/251.5 |
| 2007/0216324 A1* | 9/2007 | Liu et al. | 318/254 |
| 2008/0143323 A1* | 6/2008 | Akahane | 324/207.2 |
| 2008/0284488 A1* | 11/2008 | Sanduleanu et al. | 327/356 |

FOREIGN PATENT DOCUMENTS

| | | |
|---|---|---|
| KR | 1020100125144 A | 11/2010 |
| TW | 201042276 A | 12/2010 |

OTHER PUBLICATIONS

Male, J.C.; "Hall Effect Measurement in Semiconducting Chalcogenide Glasses and Liquids"; Brit. J. Appl. Phys.; vil. 18; p. 1543-1549; 1967.

Rzewuski, H., et al.; "Differential Method for Hall-Coefficient Measurements in an A.C. Magnetic Field"; Electronic Letters, vol. 1, No. 4; p. 86-87; Jun. 1965.

* cited by examiner

HALL MEASUREMENT SYSTEM WITH ROTARY MAGNET

CROSS-REFERENCE TO RELATED APPLICATIONS AND PRIORITY CLAIM

This application is a continuation of U.S. Non-Provisional application Ser. No. 13/560,404, entitled "HALL MEASUREMENT SYSTEM WITH ROTARY MAGNET", filed Jul. 27, 2012, which is incorporated herein by reference in its entirety.

FIELD OF INVENTION

The present disclosure relates generally to measurement techniques, and more specifically, to a Hall measurement system with a rotary magnet.

DESCRIPTION OF RELATED ART

Hall measurement is a characterization technique that may be used in a variety of applications, such as semiconductor and solid state device research. Hall measurement enables measurement of a free carrier density, which may yield carrier mobility when considered together with a resistivity measurement. The so-called Hall effect occurs when a current is passed through a material with an applied perpendicular magnetic field, such that a Hall voltage $V_H$ is generated, as provided in equation #1 as follows:

$$V_H = BI/n\,d\,e \qquad \text{Eq. \#1}$$

In equation #1 above, B is the magnetic field, I is the electric current, n is the free carrier density, d is the material thickness, and e is the charge of an electron.

A figure of merit in the Hall measurement is the Hall angle $\phi$, whose tangent is defined as the ratio between the Hall or transverse resistance ($R_{xy}$) and the longitudinal resistance ($R_{xx}$). The tangent of this Hall angle, in the case of a square sample, may be given by equation #2 as follows:

$$\tan\phi = R_{xy}/R_{xx} = B\mu \qquad \text{Eq. \#2}$$

In equation #2 above, $\mu$ is the mobility of the majority carrier.

A good or quality Hall measurement requires a sufficiently large Hall angle or $\tan\phi$ on the order of unity. Based on equation #2, a problem may arise when a sample has poor mobility (e.g., $\mu \ll 1$ cm$^2$/Vs) or the magnetic field that is available is limited (e.g., B<<0.1 Tesla). Furthermore, based on equation #1, samples with a very high carrier density n may also cause a small Hall voltage $V_H$. Some measurement environments, such as low temperature measurement, dictate the use of a very small excitation current I, thus resulting in a small Hall voltage $V_H$. In such situations, a DC magnetic field Hall measurement may yield a small Hall voltage $V_H$ buried within a large DC voltage offset due to sample geometrical asymmetry. The asymmetry may cause a mixing of the Hall or transverse resistance ($R_{xy}$) and the longitudinal resistance ($R_{xx}$).

BRIEF SUMMARY

According to one or more embodiments of the present disclosure, a system comprises a motor configured to rotate at least one magnet at a first frequency, a sensor configured to generate a reference signal of the at least one magnet's rotation, and a lock-in detection system configured to receive the reference signal, supply an excitation current at a second frequency to a device under test, measure a voltage from the device under test and demodulate the second frequency, and demodulate the first frequency from the measured voltage using the reference signal to obtain a Hall voltage associated with the device under test.

According to one or more embodiments of the present disclosure, an apparatus comprises at least one processor, and memory having instructions stored thereon that, when executed by the at least one processor, cause the apparatus to receive a reference signal associated with at least one permanent magnet's rotation at a first frequency, supply an excitation current at a second frequency to a device under test, cause a voltage from the device under test to be measured, demodulate the second frequency from the measured voltage, and demodulate the first frequency from the measured voltage using the reference signal to obtain a Hall voltage associated with the device under test.

According to one or more embodiments of the present disclosure, a system comprises a control module configured to control a speed and direction of a motor coupled to a magnet, a sample stage configured to apply a magnetic field associated with the magnet to a device under test and obtain an analog Hall signal, and a lock-in detection system configured to obtain a DC Hall voltage from the analog Hall signal based at least in part on a demodulation or filtration of frequency characteristics associated with an excitation current and the applied magnetic field.

According to one or more embodiments of the present disclosure, a method comprises generating a reference signal associated with at least one magnet's rotation at a first frequency, supplying an excitation current at a second frequency to a device under test, causing a voltage from the device under test to be measured, demodulating the second frequency from the measured voltage, and demodulating the first frequency from the measured voltage using the reference signal to obtain a Hall voltage associated with the device under test.

Additional features and advantages are realized through the techniques of the present disclosure. Other embodiments and aspects of the disclosure are described in detail herein. For a better understanding of the disclosure with the advantages and the features, refer to the description and to the drawings.

BRIEF DESCRIPTION OF THE SEVERAL VIEWS OF THE DRAWINGS

The subject matter which is regarded as the invention is particularly pointed out and distinctly claimed in the claims at the conclusion of the specification. The foregoing and other features and advantages of the disclosure are apparent from the following detailed description taken in conjunction with the accompanying drawings in which:

DETAILED DESCRIPTION

In accordance with various aspects of the disclosure, a highly sensitive Hall effect measurement system employing a rotary magnet system and a super lock-in detection scheme is described. A Hall measurement may be conducted using one or more small permanent magnets, potentially reducing a setup footprint. In contrast, a similar traditional Hall measurement may employ a bulky electromagnetic coil system requiring a large power supply and a water cooling system. Embodiments of the disclosure may measure materials with a very small Hall signal due to very high doping density or very poor mobility and can be implemented in a very tight or limited space, such as inside a cryostat.

It is noted that various connections are set forth between elements in the following description and in the drawings (the contents of which are included in this disclosure by way of reference). It is noted that these connections in general and, unless specified otherwise, may be direct or indirect and that this specification is not intended to be limiting in this respect. In this regard, a coupling of entities may refer to either a direct or an indirect connection.

Figure 1:
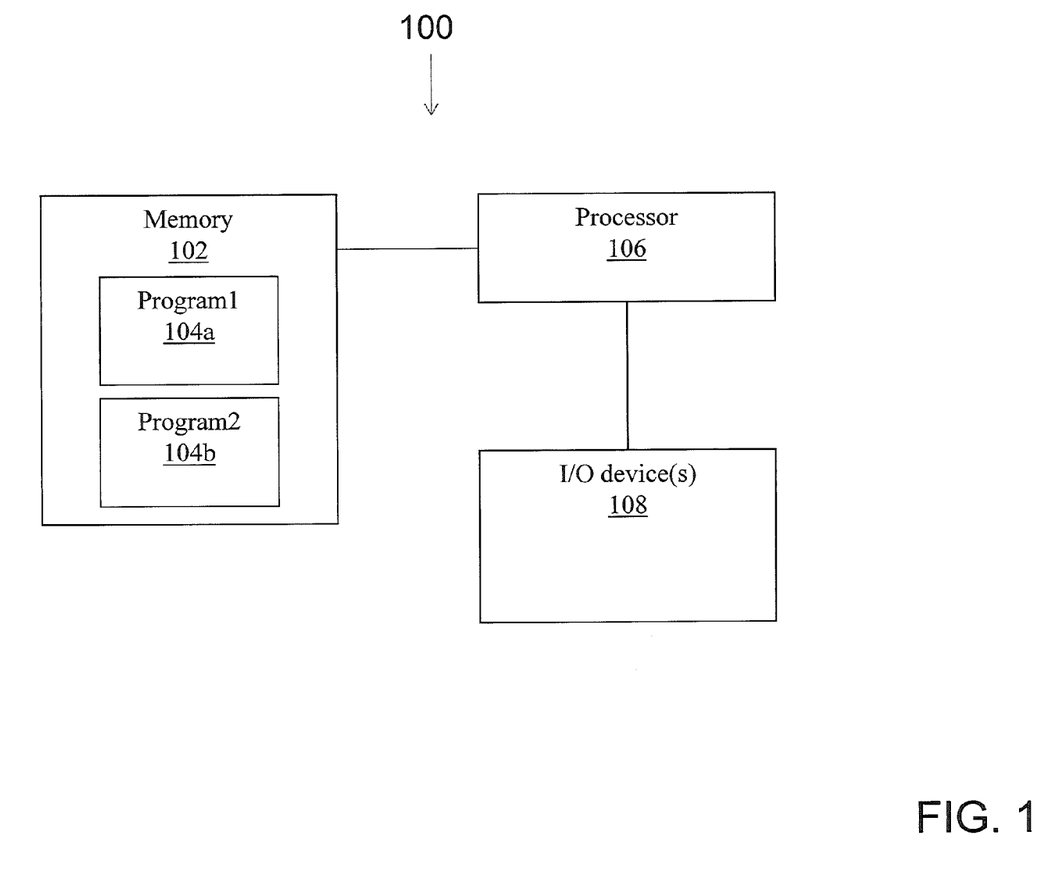
FIG. 1 is a schematic block diagram illustrating an exemplary computing system in accordance with one or more aspects of this disclosure.

Referring to FIG. 1, an exemplary computing system 100 is shown. The system 100 is shown as including a memory 102. The memory 102 may store executable instructions. The executable instructions may be stored or organized in any manner and at any level of abstraction, such as in connection with one or more processes, routines, methods, etc. As an example, at least a portion of the instructions are shown in FIG. 1 as being associated with a first program 104a and a second program 104b.

The instructions stored in the memory 102 may be executed by one or more processors, such as a processor 106. The processor 106 may be coupled to one or more input/output (I/O) devices 108. In some embodiments, the I/O device(s) 108 may include one or more of a keyboard, a touchscreen, a display screen, a microphone, a speaker, a mouse, a button, a remote control, a joystick, a printer, etc. The I/O device(s) 108 may be configured to provide an interface to allow a user to interact with the system 100.

The system 100 is illustrative. In some embodiments, one or more of the entities may be optional. In some embodiments, additional entities not shown may be included. For example, in some embodiments the system 100 may be associated with one or more networks, which may be communicatively coupled to one another via one or more switches, routers, or the like. In some embodiments, the entities may be arranged or organized in a manner different from what is shown in FIG. 1. One or more of the entities shown in FIG. 1 may be associated with one or more of the devices or entities described herein.

Figure 2:
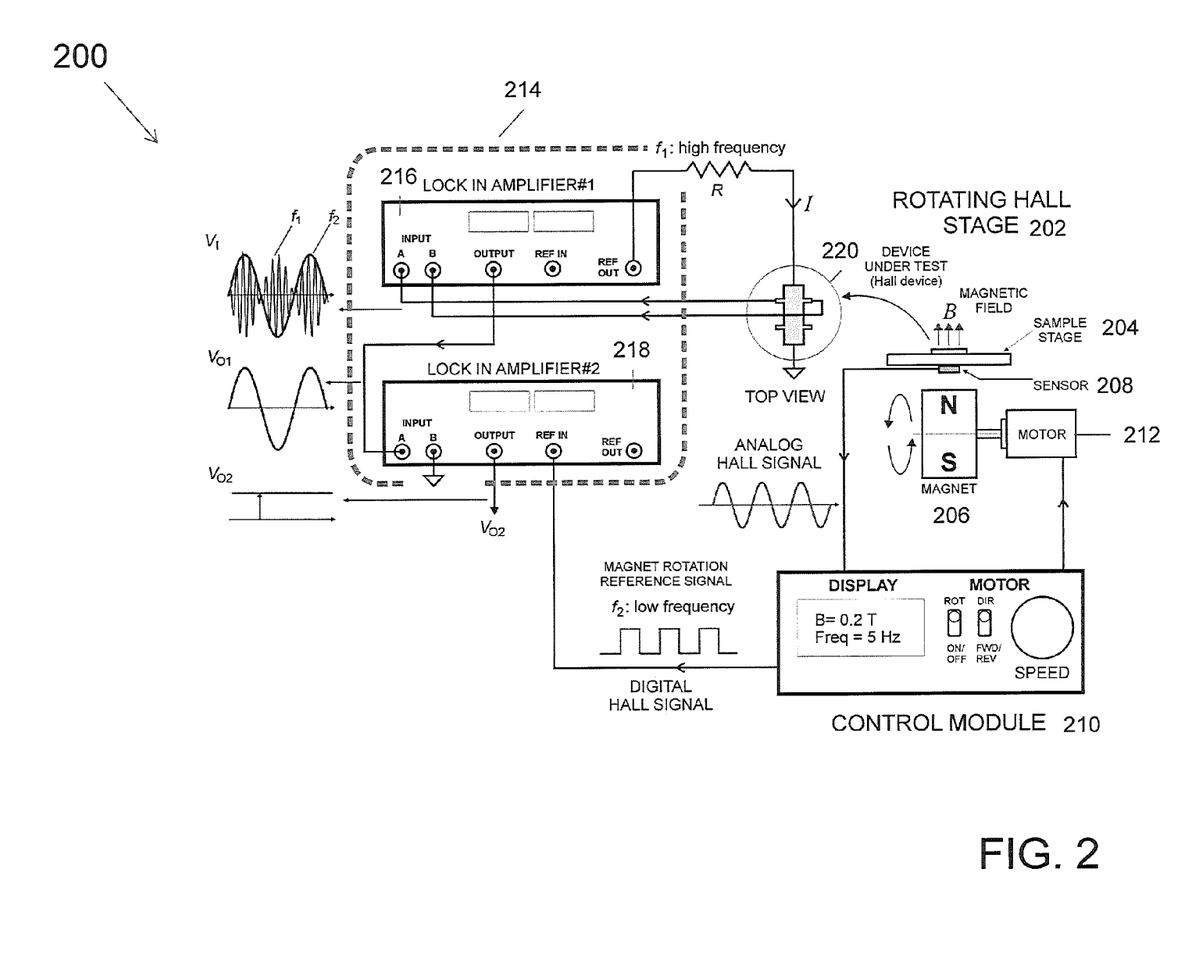
FIG. 2 is a schematic block diagram illustrating an exemplary system architecture in accordance with one or more aspects of this disclosure.

FIG. 2 illustrates a system architecture 200 that may be used to illustrate a rotary Hall measurement system. In some embodiments, the architecture 200 may be operative in connection with one or more devices or entities, such as the devices and entities described above in connection with the system 100 of FIG. 1.

The architecture 200 may include a rotating Hall stage 202. The rotating Hall stage 202 may include a sample stage 204, a magnet 206, and a sensor 208 (e.g., a Hall sensor or an optical sensor).

The architecture 200 may include a control module 210. The control module 210 may be configured to control the speed and/or direction of one or more motors, such as a motor 212. The control module 210 may be configured to provide a magnetic field (B) and/or rotation frequency read-out. The control module 210 may be configured to produce or generate a digital Hall or clock signal from an analog Hall signal.

The architecture 200 may include a lock-in detection system 214. The lock-in detection system 214 may include one or more lock-in amplifiers, such as amplifiers 216 and 218.

The architecture 200 may utilize a "super lock-in" detection scheme to enable detection of a very small Hall voltage, potentially removing a DC offset in the process. A principle of operation of the architecture 200 is described below.

The amplifier 216 may supply via a reference output an AC excitation current (I) to a device under test 220. The excitation current may take the form of a sinusoid, such as $I=I_0 \cos \omega_1 t$, where $I_0$ may be the amplitude of the excitation current I and $\omega_1=2\pi f_1$. $f_1$ may be a relatively high frequency (e.g., approximately 100 Hz or higher). The application of the excitation current I and magnetic field B may generate an AC Hall voltage. The current I can be produced from the voltage reference output (REF OUT) of the lock in amplifier and a shunt resistor R.

Concurrent with the application of the excitation current I to the device under test 220, the magnet 206 may be made to rotate at a frequency $f_2$. $f_2$ may be a relatively low frequency, such as approximately 1 Hz to 10 Hz. The rotation of the magnet 206 may cause an oscillation in the Hall voltage following equation #1, as provided in equation #3 as follows:

$$V_I \sim (I_0 \cos \omega_1 t) \times (B_0 \cos \omega_2 t) \qquad \text{Eq. \#3}$$

The symbol '~' means "proportional to", $\omega_2=2\pi f_2$ and $B_0$ represents the magnitude or amplitude of the magnetic field associated with the magnet 206. The signal $V_I$ may be provided to the 'A' and 'B' inputs of the amplifier 216. The signal $V_I$ may include two frequency components corresponding to frequencies $f_1$ and $f_2$.

The amplifier 216 may operate at a time constant $\tau_1$ such that the amplifier 216 may demodulate the frequency $f_1$. In other words, the amplifier 216 may filter out the frequency $f_1$ and pass through the frequency $f_2$ with respect to the input signal $V_I$. Following the filtration performed by the amplifier 216, the output of the amplifier 216 may correspond to a signal $V_{O1}$ of the form given by equation #4 as follows:

$$V_{O1} \sim I_0 B_0 \cos \chi_2 t \qquad \text{Eq. \#4}$$

The signal $V_{O1}$ may be provided from the output of the amplifier 216 and may be provided to an input (e.g., the 'A' input) of the amplifier 218. A second input (e.g., the 'B' input) of the amplifier 218 may be coupled to a reference, such as ground.

The sensor 208 may be placed underneath the magnet 206 and may be associated with the sample stage 204. The sensor 208 may generate or produce an analog Hall signal, which may be provided to the control module 210. The control module 210 may generate a digital clock signal with a frequency $f_2$ based on the analog Hall signal. The clock signal may be provided to a reference input of the amplifier 218.

The amplifier 218 may lock-in to $f_2$ using a large time constant $\tau_2$ to demodulate frequency $f_2$ or filter off the oscillation associated with signal $V_{O1}$. The output of the amplifier, denoted as a signal $V_{O2}$, may take the form given by equation #5 as follows:

$$V_{O2} \sim I_0 \times B_0 \qquad \text{Eq. \#5}$$

Thus, as provided in equation #5, the Hall voltage may be proportional to the product of the magnitude of the excitation current and the magnitude of the magnetic field.

In some embodiments, the lock-in detection system 214 may include one or more computers and/or voltmeters. For example, in some embodiments, one or more both of the amplifiers 216 and 218 might not be used. The computers and/or voltmeters may be configured to perform software lock-in detection. Such replacement may be particularly effective with respect to the amplifier 218, because the frequency $f_2$ may be relatively small and the signal associated with $f_2$ may be captured by the voltmeter and the computer.

Figure 3:
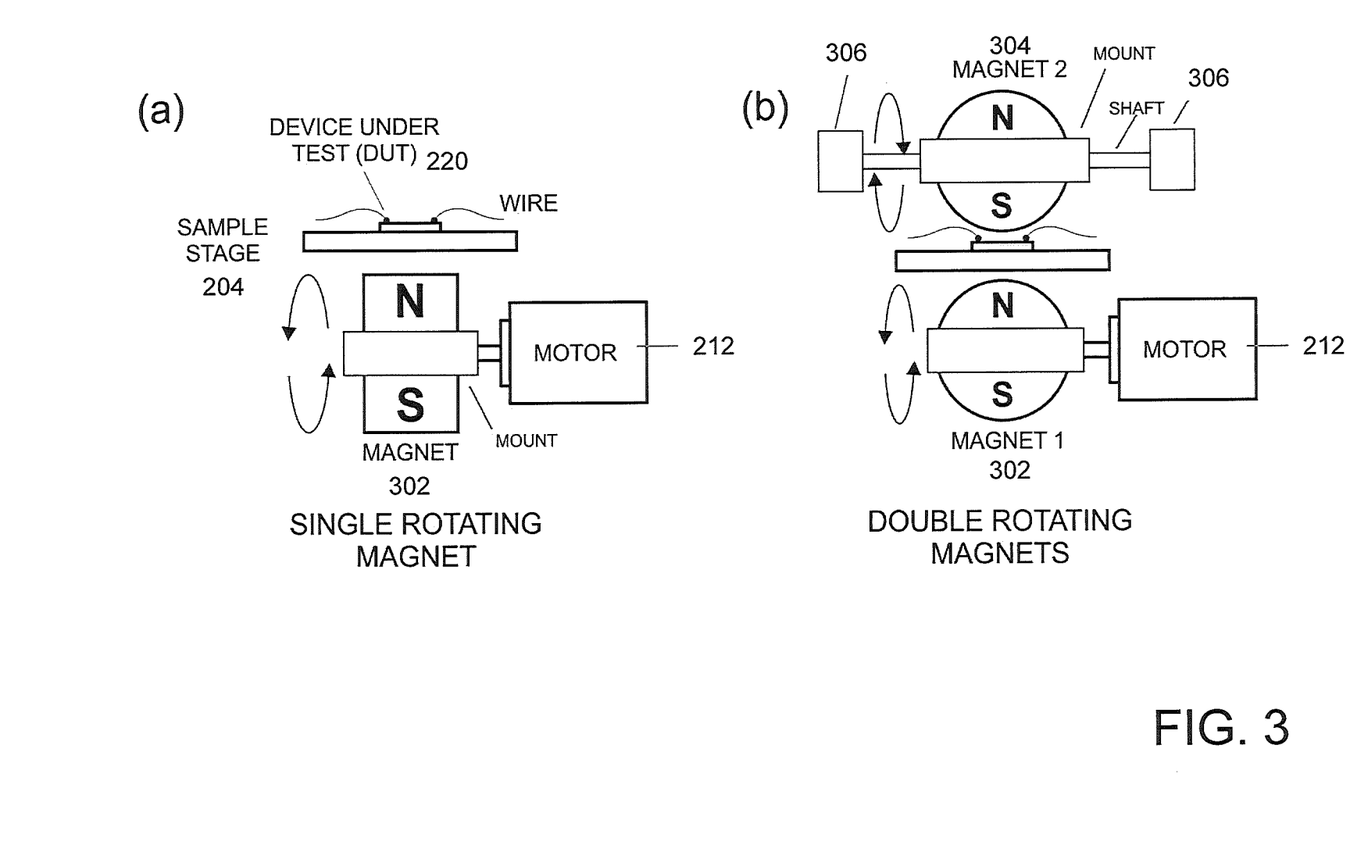
FIG. 3 is a diagram illustrating exemplary rotatable magnet configurations in accordance with one or more aspects of this disclosure.

FIG. 3 illustrates exemplary configurations in connection with the magnet 206. In the first configuration labeled (a) in FIG. 3, a single magnet 302 (which may correspond to the magnet 206 in some embodiments) may be mounted to the motor 212. The magnet 302 may be a cylindrical magnet. A cylindrical magnet may provide a relatively uniform magnetic field, at the potential expense of having to observe a minimum clearance between the cylindrical magnet and the sample stage 204. The magnet 302 may be a spherical magnet. A spherical magnet may allow the magnet 302 to get closer to the sample, albeit at the potential expense of degraded uniformity relative to a cylindrical magnet.

In the second configuration (labeled (b)) in FIG. 3, a second magnet 304 may be used in addition to the magnet 302. Two magnets (e.g., magnets 302 and 304) may be used in the second configuration to increase the strength of the magnetic field on the sample relative to the first configuration. One or both of the magnets 302 and 304 may be a spherical magnet. As before, the magnet 302 may be mounted to the motor 212 such that the magnet 302 may rotate based on a drive supplied by the motor 212. The magnet 304 may be mounted on bearings and rotate (e.g., freely rotate) following the magnet 302. The second configuration may provide a magnetic field that may be more uniformly oriented in a vertical direction relative to the first configuration.

In some embodiments, the motor 212 may include a DC motor or a stepper motor. The magnets 206, 302, and/or 304 may be of any shape, such as primarily cylindrical or spherical.

Figure 4:
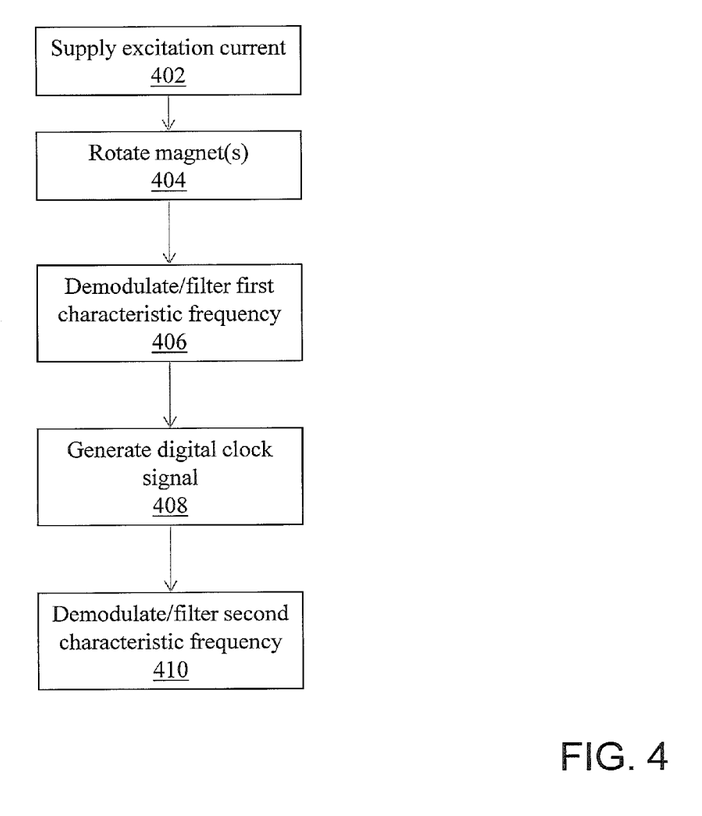
FIG. 4 is a flow diagram illustrating an exemplary method in accordance with one or more aspects of this disclosure.

FIG. 4 is a flow diagram illustrating an exemplary method in accordance with one or more aspects of this disclosure. The method may be operative in connection with one or more devices, entities, systems, or architectures, such as those described herein. In some embodiments, the method may be used to calculate a Hall voltage associated with a sample or device under test (e.g., the device under test 220).

In block 402, an excitation current may be supplied to the device under test. The excitation current may generate a voltage, such as an AC Hall voltage with a first characteristic frequency.

In block 404, one or more magnets may be rotated, generating a magnetic field at a second characteristic frequency. The magnet(s) may be rotated responsive to being driven by a motor. The speed of the motor may be controlled via a control module.

In block 406, the first characteristic frequency may be demodulated or filtered from a signal comprising the first and second characteristic frequencies. As such, a first output signal may be obtained only containing the second characteristic frequency.

In block 408, a digital clock signal may be generated based on an analog signal (e.g., an analog Hall signal). The digital clock signal may serve as a reference signal. The digital clock signal may have, or be associated with, the second characteristic frequency.

In block 410, the first output signal of block 406 may be demodulated or filtered, potentially based on the digital clock signal, such that the second characteristic frequency may be demodulated. A second output signal may be obtained that is indicative of a DC Hall voltage. The second output signal may be proportional to the product of the amplitude of the excitation current and the amplitude of the magnetic field. The second output signal and/or the DC Hall voltage may be output to one or more devices or in one or more formats. For example, the output may take the form of an analog or digital signal, a text message, an email, a voice message, a displayed graphic, etc.

It will be appreciated that the events of the method of FIG. 4 are illustrative in nature. In some embodiments, one or more of the operations or events (or a portion thereof) may be optional. In some embodiments, one or more additional operations not shown may be included. In some embodiments, the operations may execute in an order or sequence different from what is shown in FIG. 4. For example, the excitation current of block 402 may be applied concurrently with the rotation of the magnet(s) of block 404.

Embodiments of the disclosure are directed to a high sensitivity Hall measurement system employing a rotary (or AC) Hall setup that provides for a detection of a very small Hall voltage. Such an AC Hall system may remove any DC offset due to any geometrical asymmetry in the Hall sample or background magnetic field.

In some embodiments, a "super lock-in" configuration may be provided with two lock-in-amplifiers (LIA) run in tandem. A first LIA may be configured to provide a current excitation to the sample at a high frequency (e.g., $f_1$>100 Hz) and demodulate it. A second LIA may be configured to detect a Hall voltage oscillation due to one or more rotating magnets operative at a low frequency (e.g., $f_2$ approximately 1-10 Hz). In some embodiments, rotating permanent magnet(s) may be used.

In some embodiments, an AC magnetic field may be generated by one or more permanent magnetics, as opposed to electromagnetic coils. In some embodiments, one or more neodymium iron boron (NIB) magnets may be used. The magnetic field produced by a NIB permanent magnet is typically much higher than the magnetic field produced by an electromagnetic coil of the same size. In other words, for the same amount of magnetic field the space required is much smaller using an NIB permanent magnet relative to an electromagnetic coil. For example, the magnetic field produced near the surface of an NIB permanent magnet (2.5 cm×2.5 cm×2.5 cm in size) may be approximately 0.5 Tesla (or 5000 Gauss). If using a standard electromagnetic coil in Helmholtz configuration (two coils sandwiching the sample) the coil setup required to obtain the same strength magnetic field is typically very big, e.g., about 50 cm×50 cm×50 cm.

In addition to space savings, use of a permanent magnet does not require a large power supply, water cooling system and large frame assembly. Operating an electromagnetic coil in AC mode requires a different and more expensive power supply, while a permanent magnet can be rotated using a simple motor.

In some embodiments, various functions or acts may take place at a given location and/or in connection with the operation of one or more apparatuses or systems. In some embodiments, a portion of a given function or act may be performed at a first device or location, and the remainder of the function or act may be performed at one or more additional devices or locations.

As will be appreciated by one skilled in the art, aspects of this disclosure may be embodied as a system, method or computer program product. Accordingly, aspects of the present disclosure make take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the disclosure may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific example (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

Computer program code for carrying out operations for aspects of the present disclosure may be written in any combination of one or more programming language, including an object oriented programming language such as Matlab, Java, Smalltalk, C++ or the like and conventional procedural programming language, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Embodiments of the disclosure may be tied to particular machines. For example, in some embodiments a Hall voltage (e.g., a DC Hall voltage) may be obtained from a device under test. The Hall voltage may be obtained based on filtering out frequency components associated with an applied excitation current and magnetic field. One or more amplifiers, computers, magnets, and/or control modules may be used to generate the excitation current and magnetic field and to perform the filtration.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The description of the present disclosure has been presented for purposes of illustration and description, but is not intended to be exhaustive or limited to the form disclosed. Many modifications and variations will be apparent to those of ordinary skill in the art without departing from the scope and spirit of the disclosure. The embodiments were chosen and described in order to best explain the principles of the disclosure and the practical application, and to enable others of ordinary skill in the art to understand the disclosure for various embodiments with various modifications as are suited to the particular use contemplated.

The diagrams depicted herein are illustrative. There may be many variations to the diagram or the steps (or operations) described therein without departing from the spirit of the disclosure. For instance, the steps may be performed in a differing order or steps may be added, deleted or modified. All of these variations are considered a part of the disclosure.

It will be understood that those skilled in the art, both now and in the future, may make various improvements and enhancements which fall within the scope of the claims which follow.

What is claimed is:

1. A method of implementing a Hall effect measurement, the method comprising:

applying an excitation current (I) at a first frequency ($f_1$) to a device under test;

concurrently with applying the excitation current, rotating at least one magnet at a second frequency ($f_2$) in proximity to the device under test so as to generate a magnetic field (B);

providing, to a first lock-in amplifier, a first stage input Hall voltage signal ($V_1$) generated by the excitation current and the magnetic field, and proportional to the expression:

$$(I_0 \cos \omega_1 t) \times (B_0 \cos \omega_2 t);$$

wherein $I_0$ is an amplitude of the excitation current I, $B_0$ is an amplitude of the magnetic field B, $\omega_1 = 2\pi f_1$ and $\omega_2 = 2\pi f_2$;

filtering out, with the first lock in amplifier, the first frequency component $f_1$ of the first stage input Hall voltage signal so as to generate a first stage output Hall voltage signal ($V_{O1}$) proportional to the expression:

$$I_0 B_0 \cos \omega_2 t;$$

providing, to a second lock-in amplifier, the first stage output Hall voltage signal and filtering out the second frequency component $f_2$ so as to generate a second stage output Hall voltage signal ($V_{O2}$) proportional to the expression:

$$I_0 \times B_0.$$

2. The method of claim 1, further comprising generating, with a control module, a digital Hall reference signal at the second frequency component $f_2$ from an analog Hall signal at the second frequency component $f_2$ and providing the digital Hall reference signal as a reference input to the second lock-in amplifier to filter out the second frequency component $f_2$ and generate the second stage output Hall voltage signal.

3. The method of claim 1, further comprising rotating the at least one magnet using a stepper motor.

4. The method of claim 1, further comprising rotating the at least one magnet using a DC motor.

5. The method of claim 1, wherein the at least one magnet comprises at least a first magnet and a second magnet, and further comprising causing the first magnet to rotate by driving the first magnet with a motor.

6. The method of claim 5, further comprising causing the second magnet to rotate on bearings following the rotation of the first magnet.

7. The method of claim 1, wherein the first frequency is approximately between 1 Hz and 10 Hz, and wherein the second frequency is approximately 100 Hz.

8. The method of claim 1, wherein the at least one magnet comprises a Neodymium Iron Boron (NIB) permanent magnet.

9. The method of claim 1, wherein the at least one magnet comprises a primarily spherical magnet.

10. The method of claim 1, wherein the at least one magnet comprises a primarily cylindrical magnet.

11. A system for implementing a Hall effect measurement, comprising:
a first lock-in amplifier configured to apply an excitation current (I) at a first frequency ($f_1$) to a device under test;
a motor configured to rotate at least one magnet at a second frequency ($f_2$) in proximity to the device under test so as to generate a magnetic field (B), concurrently with application of the excitation current;
the first lock-in amplifier further configured to receive, a first stage input Hall voltage signal ($V_1$) generated by the excitation current and the magnetic field, and proportional to the expression:

$$(I_0 \cos \omega_1 t) \times (B_0 \cos \omega_2 t);$$

wherein $I_0$ is an amplitude of the excitation current I, $B_0$ is an amplitude of the magnetic field B, $\omega_1 = 2\pi f_1$ and $\omega_2 = 2\pi f_2$;

the first lock in amplifier further configured to filter out the first frequency component $f_1$ of the first stage input Hall voltage signal so as to generate a first stage output Hall voltage signal ($V_{O1}$) proportional to the expression:

$$I_0 B_0 \cos \omega_2 t; \text{ and}$$

a second lock-in amplifier configured to receive the first stage output Hall voltage signal and filter out the second frequency component $f_2$ so as to generate a second stage output Hall voltage signal ($V_{O2}$) proportional to the expression:

$$I_0 \times B_0.$$

12. The system of claim 11, further comprising a control module configured to generate a digital Hall reference signal at the second frequency component $f_2$ from an analog Hall signal at the second frequency component $f_2$ and to provide the digital Hall reference signal as a reference input to the second lock-in amplifier to filter out the second frequency component $f_2$ and generate the second stage output Hall voltage signal.

13. The system of claim 11, further comprising a stepper motor to rotate the at least one magnet.

14. The system of claim 11, further comprising a DC motor to rotate the at least one magnet.

15. The system of claim 11, wherein the at least one magnet comprises at least a first magnet and a second magnet, and further comprising causing the first magnet to rotate by driving the first magnet with a motor.

16. The system of claim 15, wherein the second magnet rotates on bearings following the rotation of the first magnet.

17. The system of claim 11, wherein the first frequency is approximately between 1 Hz and 10 Hz, and wherein the second frequency is approximately 100 Hz.

18. The system of claim 11, wherein the at least one magnet comprises a Neodymium Iron Boron (NIB) permanent magnet.

19. The system of claim 11, wherein the at least one magnet comprises a primarily spherical magnet.

20. The system of claim 11, wherein the at least one magnet comprises a primarily cylindrical magnet.

* * * * *